United States Patent
Seong et al.

(10) Patent No.: US 8,758,976 B2
(45) Date of Patent: Jun. 24, 2014

(54) POSITIVE PHOTOSENSITIVE POLYIMIDE COMPOSITION

(75) Inventors: Hye-Ran Seong, Daejeon (KR); Chan-Hyo Park, Daejeon (KR); Dong-Hyun Oh, Daejeon (KR); Hye-In Shin, Seoul (KR); Kyung-Jun Kim, Daejeon (KR); Se-Jin Shin, Daejeon (KR)

(73) Assignee: LG Chem Ltd., Seoul (KR)

( * ) Notice: Subject to any disclaimer, the term of this patent is extended or adjusted under 35 U.S.C. 154(b) by 20 days.

(21) Appl. No.: 12/921,281

(22) PCT Filed: Mar. 6, 2009

(86) PCT No.: PCT/KR2009/001121
§ 371 (c)(1),
(2), (4) Date: Nov. 24, 2010

(87) PCT Pub. No.: WO2009/110764
PCT Pub. Date: Sep. 11, 2009

(65) Prior Publication Data
US 2011/0059397 A1  Mar. 10, 2011

(30) Foreign Application Priority Data
Mar. 7, 2008 (KR) .................. 10-2008-0021535

(51) Int. Cl.
| C08L 79/08 | (2006.01) |
| C08L 77/04 | (2006.01) |
| G03F 7/039 | (2006.01) |
| G03F 7/075 | (2006.01) |
| H01L 51/52 | (2006.01) |
| G03F 7/023 | (2006.01) |

(52) U.S. Cl.
CPC .......... *G03F 7/0233* (2013.01); *H01L 51/5237* (2013.01)
USPC ............ 430/270.1; 430/20; 430/28; 430/191; 430/192; 430/193; 525/420; 525/436

(58) Field of Classification Search
USPC .............. 525/420, 436; 430/20, 28, 191, 192, 430/193, 270.1
See application file for complete search history.

(56) References Cited

U.S. PATENT DOCUMENTS

| 4,880,722 | A | 11/1989 | Moreau et al. |
| 4,942,108 | A | 7/1990 | Moreau et al. |
| 7,026,080 | B2 * | 4/2006 | Nakayama et al. ............. 430/18 |
| 7,157,204 | B2 | 1/2007 | Jung et al. |
| 2002/0098444 | A1 | 7/2002 | Sasaki et al. |
| 2004/0197699 | A1 | 10/2004 | Nakayama et al. |

FOREIGN PATENT DOCUMENTS

| CN | 1556939 A | 12/2004 |
| EP | 0863436 A1 * | 9/1998 |
| JP | 60-037550 A | 2/1985 |
| JP | 64-060630 A | 3/1989 |
| JP | 07-033874 A | 2/1995 |
| JP | 07-134414 A | 5/1995 |
| JP | 07-138479 A | 5/1995 |
| JP | 11-084653 A | 3/1999 |
| JP | 11-338143 A | 12/1999 |
| JP | 2000-199958 A | 7/2000 |
| JP | 2004-156012 A | 6/2004 |
| JP | 2005-242328 A | 9/2005 |
| JP | 2007-133377 A | 5/2007 |
| JP | 2007-183388 A | 7/2007 |
| JP | 2008-040324 A | 2/2008 |
| KR | 10-2003-0085166 A | 11/2003 |
| WO | 03/029899 A1 | 4/2003 |

OTHER PUBLICATIONS

English language abstract of JP 52013315, 3 pages.

* cited by examiner

*Primary Examiner* — Ana Woodward
(74) *Attorney, Agent, or Firm* — Rothwell, Figg, Ernst & Manbeck, P.C.

(57) ABSTRACT

The present invention relates to a positive photosensitive polyimide composition that includes polyimide, a polyamic acid, and a photoactive compound. An organic insulating layer for organic light-emitting devices (OLED), which includes the positive photosensitive polyimide composition, may control a taper angle and outgassing, and has excellent adhesion in respects to a substrate, water repellent control ability, and storage stability and the like.

8 Claims, No Drawings

POSITIVE PHOTOSENSITIVE POLYIMIDE COMPOSITION

CROSS REFERENCE TO RELATED APPLICATIONS

This application is a 35 U.S.C. §371 National Phase Entry Application from PCT/KR2009/001121, filed Mar. 6, 2009, and designating the United States, which claims priority under 35 U.S.C. §119 to Korean Patent Application No. 10-2008-0021535 filed Mar. 7, 2008, which is incorporated herein in its entirety.

TECHNICAL FIELD

The present invention relates to a positive photosensitive polyimide composition that includes polyimide, a polyamic acid, and a photoactive compound.

This application claims priority from Korean Patent Application No. 10-2008-0021535 filed on Mar. 7, 2008 in the Korean Intellectual Property Office, the disclosure of which is incorporated herein by reference in its entirety.

BACKGROUND ART

Currently, in order to form an interlayer insulating layer and the like of an organic light-emitting device, photosensitive polyimide that has heat resistance is actively used.

The photosensitive polyimide is advantageous in that physical properties such as heat resistance, mechanical strength and the like are excellent, there are excellent electric properties such as low dielectricity, high insulating property and the like, planarization property on a coated surface is good, the content of impurity that reduces the reliability of a device is very low, and fine shapes are easily obtained.

Polyimide may be classified into a negative photosensitive polyimide and a positive photosensitive polyimide, but many studies have been actively made of the positive photosensitive polyimide because of the following reasons.

First, the positive photosensitive polyimide has more excellent resolution than the negative photosensitive polyimide. Second, since the positive photosensitive polyimide has relatively smaller light irradiation area than the negative photosensitive polyimide, there is a low possibility of defects. Third, in the negative manner, since organic solvents such as N-methyl-2-pyrrolidone (NMP) or dimethyl acetamide (DMAc) are used as the developing solution, there are problems in views of environments such as cost, waste water treatment and the like. However, in the positive manner in which the alkali aqueous solution is used as the developing solution, cost is reduced and it is environmentally friendly.

To be specific, there are the following patent publications in respects to the positive photosensitive polyimide.

Japanese Unexamined Patent Application Publication Nos. 52-13315 and 62-135824 disclose a method for manufacturing a pattern using a difference between solubilities of an exposed portion and a non-exposed portion by mixing a polyamic acid as a polyimide precursor and a naphtoquinonediazide compound that is a dissolution inhibiting agent with each other. However, the method is problematic in that the difference between solubilities of the exposed portion and the non-exposed portion is not large enough to form a pattern having high resolution.

In addition, Japanese Unexamined Patent Application Publication No. 64-60630 discloses a method for mixing soluble polyimide that has a hydroxy group and a naphtoquinonediazide compound with each other. However, the method is problematic in that the addition content of photosensitizer is large, the structure of the polyimide precursor is limited, and physical properties are poor.

In addition, Japanese Unexamined Patent Application Publication No. 60-37550 discloses a method for performing ester bonding of an o-nitrobenzylester group that is a photosensitive group to a precursor. However, the method is problematic in that it is difficult to improve the thickness of the layer because of the low strength.

In addition, Japanese Unexamined Patent Application Publication Nos. 7-33874 and 7-134414 disclose a chemical amplification composition that is manufactured by mixing a resin that is obtained by substituting a carboxy group of a polyamic acid with an acetal group that is dissociated by an acid with a photoacid generating agent. However, there is a problem in that the residual layer ratio of the composition is excellent but the layer shrinkage is high after the curing and physical properties are poor.

As described above, although the positive photosensitive polyimide has many advantages, commercialization thereof has not been yet made up to the present because of the above problems which should be overcome.

DISCLOSURE OF INVENTION

Technical Problem

The present invention has been made to keep in mind the above problems occurring in the related art, and it is an object of the present invention to provide a positive photosensitive polyimide composition that may control a taper angle and outgassing, and has excellent adhesion, water repellent control ability, and storage stability and the like, and an organic insulating layer for organic light-emitting devices, which comprises the same.

Technical Solution

The present invention provides a positive photosensitive polyimide composition that comprises 1) polyimide, 2) polyamic acid, and 3) photoactive compound.

In addition, the present invention provides an organic insulating layer for organic light-emitting devices, which comprises the photosensitive film that is obtained from the photosensitive polyimide composition.

Advantageous Effects

A organic insulating layer for OLED that is manufactured by using the positive photosensitive polyimide composition according to the present invention may control a low taper angle and outgassing, and has excellent adhesion, water repellent control ability, and storage stability and the like. Thus, the organic light-emitting device that includes the organic insulating layer may realize high resolution.

BEST MODE FOR CARRYING OUT THE INVENTION

Hereinafter, the present invention will be described in detail.

Since a positive photosensitive polyimide composition according to the present invention includes polyimide, it may control a taper angle and outgassing, and has excellent adhesion, water repellent control ability, and storage stability.

In detail, a positive photosensitive polyimide composition according to the present invention comprises:

1) a polyimide that includes the repeating unit that is represented by the following Formula 1;
2) a polyamic acid that includes the repeating unit that is represented by the following Formula 2; and
3) a photoactive compound:

[Formula 1]

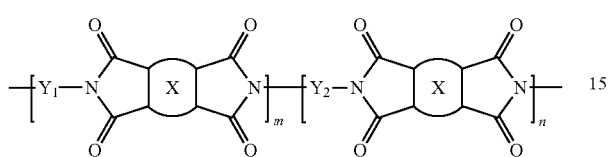

wherein m is an integer in the range of 1 to 30, n is an integer in the range of 1 to 10, X is a tetravalent aromatic organic group,
$Y_1$ is a divalent aromatic organic group,
$Y_2$ is a divalent silicon based substituent group,

[Formula 2]

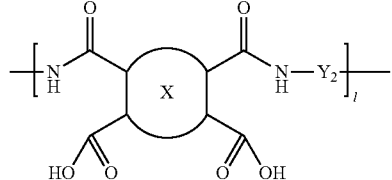

wherein l is an integer in the range of 1 to 20,
X is a tetravalent aromatic organic group, and
$Y_2$ is a divalent silicon based substituent group.

In the repeating unit that is represented by Formula 1 or 2, it is preferable that X is any one selected from the group consisting of tetravalent aromatic organic groups that are represented by the following Formulas, but is not limited thereto.

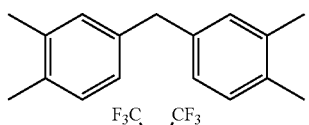

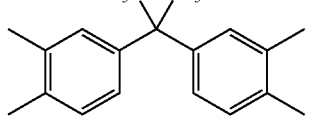

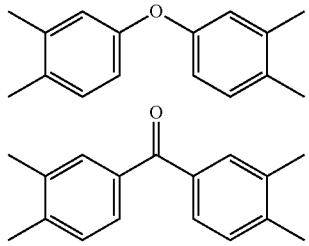

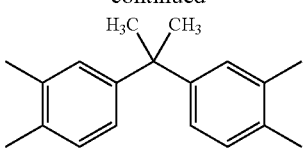

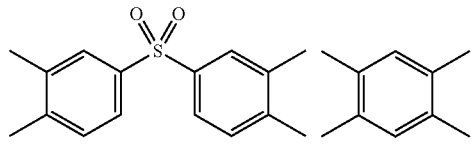

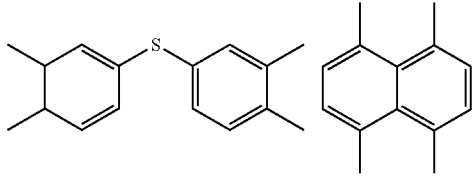

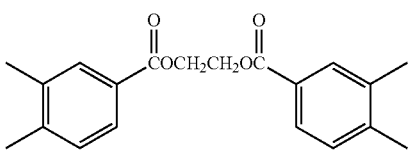

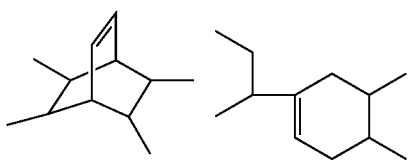

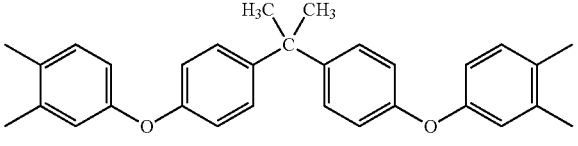

In addition, in the repeating unit that is represented by Formula 1, it is preferable that $Y_1$ is any one selected from the group consisting of divalent aromatic organic groups that are represented by the following Formulas, but is not limited thereto.

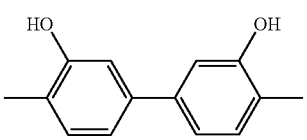

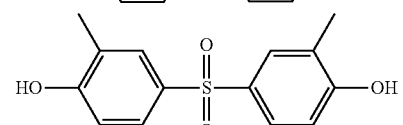

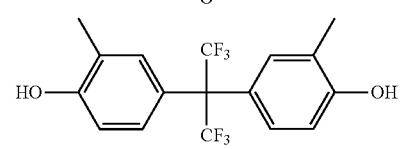

-continued

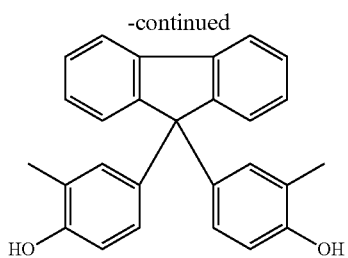

In addition, in the repeating unit that is represented by Formula 1 or 2, it is preferable that $Y_2$ is a divalent silicon based substituent group represented by the following Formula, but is not limited thereto.

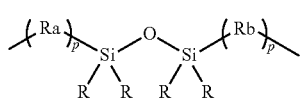  [Formula 3]

wherein p is an integer in the range of 3 to 5,

R may be the same as or different from each other, and any one that is selected from the group consisting of —$CH_3$, —$CH_2CH_3$ and —$CH_2CH_2CH_3$, and Ra and Rb may be the same as or different from each other, and each independently straight- or branched-chained alkylene group having 3 to 5 carbon atoms.

In general, polyimide has better storage stability than the polyamic acid or polyamic acid ester, and may be cured at a low temperature. In addition, in the imidization process, since there is no moisture or alcohols discharged, it is possible to control outgassing.

Polyimide that includes the repeating unit represented by Formula 1 is characterized in that polyimide having excellent physical properties includes a phenolic hydroxy group. By having the phenolic hydroxy group, the solubility in respects to the alkali aqueous solution that is the developing solution is excellent. In some cases, the polyimide may have an end functional group in order to control a molecular weight distribution at an end thereof. In addition, since polyimide includes a silicon based substituent group, it may have an excellent effect of realization of a low taper angle as compared to the case of when polyimide does not include the silicon based substituent group.

Since the polyamic acid that includes the repeating unit that is represented by Formula 2 includes the silicon based substituent group that is represented by Formula 3, it may control the low taper angle and may provide an appropriate glass transition temperature Tg and water repellent control ability. In particular, since the polyamic acid includes the silicon based substituent group, the silicon portion having strong hydrophobicity forms a surface layer to generate an organic insulating layer having a double layer structure. The double layer structure may show an excellent effect for improving a water repellent ability. In some cases, the polyamic acid may have an end functional group in order to control a molecular weight distribution at an end thereof.

It is preferable that the end functional group that may be included in the polyimide and polyamic acid is any one selected from the group consisting of hexahydroisobenzofurane-1,3-dione, phthalic anhydride and aniline, but not limited thereto.

The photoactive compound that is included in the positive photosensitive polyimide composition according to the present invention includes a diazonaphtoquinone based photosensitive material, and means a compound that is capable of generating an acid when light is irradiated thereonto. It is preferable that it includes one or more selected from the group consisting of the compounds that are represented by the following Formulas.

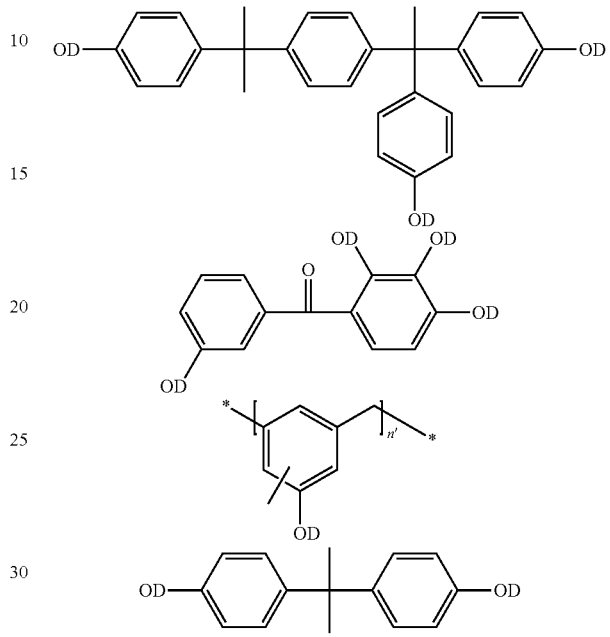

wherein OD is

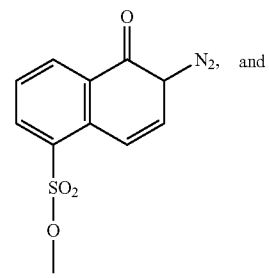

n' is an integer in the range of 5 to 20.

The positive photosensitive polyimide composition according to the present invention includes 60 to 95% by weight of polyimide and 5 to 40% by weight of the polyamic acid, and 1 to 50 parts by weight of the photoactive compound on the basis of 100 parts by weight of the total weight of the polyimide and the polyamic acid. The weights are values that are calculated on the basis of solids.

In the case of when the content of the polyamic acid is within the above range, the case is advantageous in that the taper angle is not increased, a photoproperty is sufficiently rapid, the occurrence of scum on a coating surface, or the occurrence of an overdeveloping phenomenon is prevented.

It is preferable that the positive photosensitive polyimide composition further includes one or more that are selected from the group consisting of an adhesion promoting agent, a surfactant and a solvent.

The adhesion promoting agent is an element that has a function of improving adhesion in respects to a substrate, and for example, a silane coupling agent that has a reactive functional group such as a carboxyl group, a methacryloyl group, a vinyl group, an isocyanate group, an epoxy group and the like is preferable. In detail, it is one or more that are selected from the group consisting of trimethoxysilyl benzoic acid, γ-methacryloyl oxypropyltrimethoxysilane, vinyltriacetoxysilane, vinyltrimethoxysilane, γ-isocyanatepropyltriethoxysilane, γ-glycidoxypropyltrimethoxysilane and β-(3,4-epoxycyclohexyl)ethyltrimethoxysilane, but is not limited thereto.

It is preferable that the content of the adhesion promoting agent is in the range of 0.01 to 10 parts by weight on the basis of 100 parts by weight of the total weight of the polyimide and the polyamic acid.

In addition, the surfactant is an element that has a function for improving a coating property, an application property, uniformity and stain removal ability in respects to a substrate, and one or more selected from the group consisting of a fluorine based surfactant, a silicon based surfactant and a non-ion based surfactant but is not limited thereto.

It is preferable that the content of the surfactant is in the range of 0.01 to 10 parts by weight on the basis of 100 parts by weight of the total weight of the polyimide and the polyamic acid.

The solvent is not particularly limited if it is anything that is capable of dissolving a polyimide based polymer compound. For example, it is one or more selected from the group consisting of N,N-dimethylformamide, N,N-dimethylacetamide, N-methylpyrrolidone, N-vinylpyrrolidone, N-methyl caprolactam, dimethylsulfoxide, tetramethyl urea, pyridyne, dimethylsulfone, hexamethylsulfoxide, m-cresol, γ-butyrolactone, ethylcellosolve, butylcellosolve, ethylcarbitole, butylcarbitole, ethylcarbitole acetate, butylcarbitole acetate, ethyleneglycol, ethyl lactate, butyl lactate, cyclohexanone, and cyclopentanone.

In addition, the organic insulating layer for OLED that is manufactured by using the positive photosensitive polyimide composition according to the present invention has a double layer structure in which a silicon portion is formed on a surface thereof. Since the silicon portion has strong hydrophobicity, the organic insulating layer has an excellent water repellent control ability.

In the method for manufacturing the organic insulating layer for OLED according to the present invention, the method for coating the positive photosensitive polyimide composition on the substrate is not particularly limited, but a method that is known in the art may be used. For example, a coating method such as spin coating, dip coating, roll coating, screen coating, spray coating, flow coating, screen printing, ink jet, drop casting and the like may be used.

The positive photosensitive polyimide composition according to the present invention may use an alkali aqueous solution as a developing solution, and this is environmentally friendly and economic as compared to an organic solvent. Examples of the alkali developing solution may include an aqueous solution of tertiary ammonium hydroxide such as tetramethylammonium hydroxide, tetraethylammonium hydroxide, or an amine based aqueous solution such as ammonia, ethylamine, propylamine, diethylamine, and triethylamine. Among them, in general, the tetramethylammonium hydroxide (TMAH) aqueous solution is most frequently used.

As an example, the positive photosensitive polyimide composition is spin coated on the silicon wafer substrate, prebaked at about 120° C. for 2 min to form a film. The film is treated with a single UV of i, g or h lines, or UV of mixed rays by using a photomask. The exposure amount varies according to the thickness of the coated film and in general exposure is carried out by using energy in the range of 500 to 1000 mJ/cm$^2$. After the exposure is finished, the pattern is developed by using 0.38 to 2.39 wt % of tetramethylammonium hydroxide aqueous solution. The developing is generally carried out for 30 to 120 sec, and it is dipped in deionized water after the developing for 10 to 30 sec to wash. Next, it is postbaked at 230° C. for about 30 to 60 min to obtain a desired pattern. Through this process, it can be seen that a positive pattern is formed on a desired portion along a pattern of a photomask.

The thickness of the obtained insulating layer according to the present invention may vary according to the purpose and is preferably in the range of 0.7 to 10 μm but is not limited thereto.

MODE FOR THE INVENTION

A better understanding of the present invention may be obtained in light of the following Examples which are set forth to illustrate, but are not to be construed to limit the present invention.

Preparation Example 1

Manufacturing of Polyimide PI-1

133 g (0.30 mole) of 4,4'-hexafluoroisopropylidenediphthalic anhydride as the acid anhydride component, and 87 g (0.31 mole) of bis(3-amino-4-hydroxyphenyl)sulfone and 16 g (0.07 mole) of 1,3-bis(3-aminopropyl)tetramethyldisiloxane as the diamine component were dissolved in 460 g of GBL (γ-butyrolactione) and 92 g of toluene and reacted with each other at 180° C. for 3 hours while the generated water was removed by using the Dean-Stark device. In addition, while it was heated at 180° C. for 1 hour, toluene was removed in the solution to obtain 711 g of polyimide PI-1 that was represented by the following Formula 4 and had the solid concentration of 34% and the intrinsic viscosity of 0.52 dl/g.

[Formula 4]

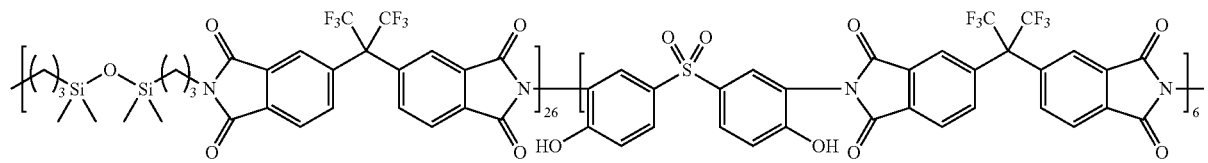

Preparation Example 2

Manufacturing of Polyimide PI-2

133 g (0.30 mole) of 4,4'-hexafluoroisopropylidenediphthalic anhydride as the acid anhydride component, and 87 g (0.31 mole) of bis(3-amino-4-hydroxyphenyl)sulfone and 13 g (0.07 mole) of 4,4'-oxydianiline as the diamine component were dissolved in 450 g of GBL (γ-butyrolactione) and 91 g of toluene and reacted with each other at 180° C. for 3 hours while the generated water was removed by using the Dean-Stark device. In addition, while it was heated at 180° C. for 1 hour, toluene was removed in the solution to obtain 720 g of polyimide PI-2 that was represented by the following Formula 5 and had the solid concentration of 34% and the intrinsic viscosity of 0.61 dl/g.

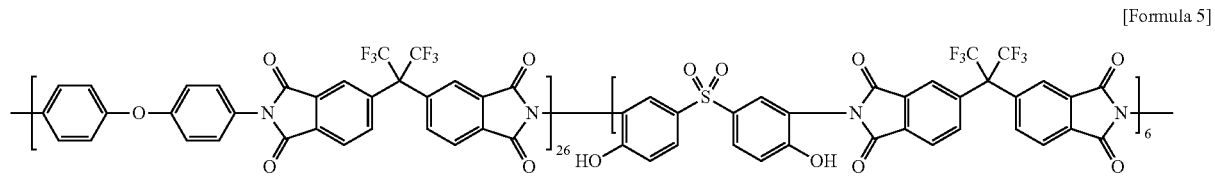

Preparation Example 3

Manufacturing of the Polyamic Acid PAA-1

93 g (0.21 mole) of 4,4'-hexafluoroisopropylidenediphthalic anhydride as the acid anhydride component, and 45 g (0.18 mole) of 1,3-bis(3-aminopropyl)tetramethyldisiloxane as the diamine component were dissolved in 410 g of GBL (γ-butyrolactione) and reacted with each other at normal temperature for 24 hours to obtain 400 g of polyimic acid PAA-1 that was represented by the following Formula 6 and had the solid concentration of 25% and the intrinsic viscosity of 0.74 dl/g.

[Formula 6]

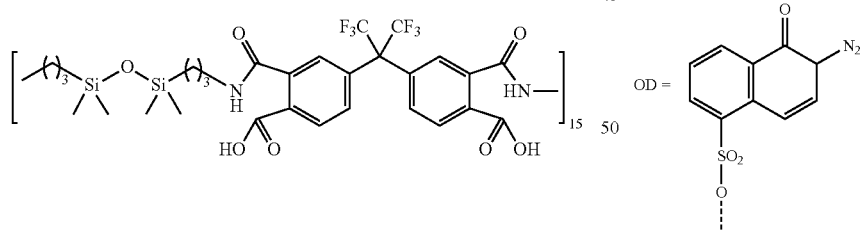

Preparation Example 4

Manufacturing of the Polyamic Acid PAA-2

93 g (0.21 mole) of 4,4'-hexafluoroisopropylidenediphthalic anhydride as the acid anhydride component, and 36 g (0.18 mole) of 4,4'-oxydianiline as the diamine component were dissolved in 380 g of GBL (γ-butyrolactione) and reacted with each other at normal temperature for 24 hours to obtain 400 g of polyimic acid PAA-2 that was represented by the following Formula 7 and had the solid concentration of 25% and the intrinsic viscosity of 0.81 dl/g.

[Formula 7]

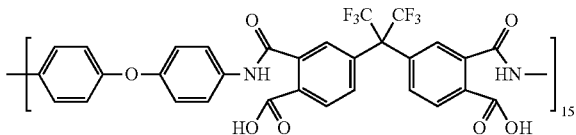

Example 1

To 35 g of polyimide PI-1 that was manufactured in Preparation Example 1 and 20 g of the polyamic acid PAA-1 that was manufactured in Preparation Example 3, 7 g of the diazonaphtoquinone ester compound (TPPA 320: OH and OD were selectively given according to the ratio of OD/(OD+OH)=2/3) that was represented by the following Formula 8 as the photoactive compound and 38 g of the solvent GBL were added, agitated at room temperature for 1 hour, and filtered by using the filter of 0.2 μm to manufacture the positive photosensitive polyimide composition A.

[Formula 8]

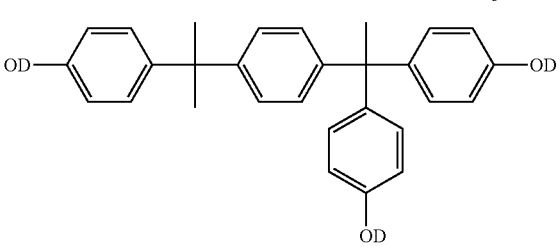

Example 2

To 40 g of polyimide PI-1 that was manufactured in Preparation Example 1 and 13 g of the polyamic acid PAA-1 that was manufactured in Preparation Example 3, 7 g of the diazonaphtoquinone ester compound TPPA 320 that was represented by the following Formula 8 as the photoactive compound and 40 g of the solvent GBL were added, agitated at room temperature for 1 hour, and filtered by using the filter of 0.2 μm to manufacture the positive photosensitive polyimide composition B.

Comparative Example 1

To 55 g of polyimide PI-1 that was manufactured in Preparation Example 1, 7 g of the diazonaphtoquinone ester compound TPPA 320 that was represented by the following Formula 8 as the photoactive compound and 38 g of the solvent GBL were added, agitated at room temperature for 1 hour, and filtered by using the filter of 0.2 µm to manufacture the positive photosensitive polyimide composition C.

Comparative Example 2

To 53 g of polyamic acid PAA-1 that was manufactured in Preparation Example 3, 7 g of the diazonaphtoquinone ester compound TPPA 320 that was represented by the following Formula 8 as the photoactive compound and 40 g of the solvent GBL were added, agitated at room temperature for 1 hour, and filtered by using the filter of 0.2 µm to manufacture the positive photosensitive polyimide composition D.

Comparative Example 3

To 35 g of polyimide PI-2 that was manufactured in Preparation Example 2 and 20 g of the polyamic acid PAA-2 that was manufactured in Preparation Example 4, 7 g of the diazonaphtoquinone ester compound TPPA 320 that was represented by the Formula 8 as the photoactive compound and 38 g of the solvent GBL were added, agitated at room temperature for 1 hour, and filtered by using the filter of 0.2 µm to manufacture the positive photosensitive polyimide composition E.

Comparative Example 4

To 35 g of polyimide PI-1 that was manufactured in Preparation Example 1 and 20 g of the polyamic acid PAA-2 that was manufactured in Preparation Example 4, 7 g of the diazonaphtoquinone ester compound TPPA 320 that was represented by the Formula 8 as the photoactive compound and 38 g of the solvent GBL were added, agitated at room temperature for 1 hour, and filtered by using the filter of 0.2 µm to manufacture the positive photosensitive polyimide composition F.

Comparative Example 5

To 35 g of polyimide PI-2 that was manufactured in Preparation Example 2 and 20 g of the polyamic acid PAA-1 that was manufactured in Preparation Example 3, 7 g of the diazonaphtoquinone ester compound TPPA 320 that was represented by the Formula 8 as the photoactive compound and 38 g of the solvent GBL were added, agitated at room temperature for 1 hour, and filtered by using the filter of 0.2 µm to manufacture the positive photosensitive polyimide composition G.

Experimental Example 1

Evaluation of Physical Properties Such as Optimum Exposure Energy, Residual Layer Ratio, Adhesion, Taper Angle Measurement Value, Water Repellency, and Double Layer Structure The photosensitive composition solutions that were manufactured in Examples and Comparative Examples were each spin coated on the 4" wafer, and prebaked on the hot plate at 120° C. for 120 sec to form the film having the thickness of 1.4 µm. The wafer that was subjected to the prebaking treatment was sequentially exposed by using the G-line stepper Nikon NSR 1505 G4 from 20 mJ/cm$^2$ to 600 mJ/cm$^2$ at an interval of 5 mJ/cm$^2$. At this time, in the used mask, line/space patterns and circular patterns are repeatedly formed from 1 µm to 10 µm at intervals of 1 µm. After it was developed in 2.38 wt % tetramethylammonium hydroxide aqueous solution at 23° C. for 60 sec, it was washed with ultrapure water for 60 sec and dried to form the pattern. After it was developed with optimum exposure energy for transferring the same pattern as the line/space patterns of 10 µm of the mask, the residual layer ratio of the layer of the non-exposed portion was measured.

The adhesion was determined by using the size of the minimum pixel that remained after the development when the exposing was carried out by using the line & space mask.

The taper angle was measured by measuring the angle of the pattern section of 20 µm using SEM, and the generation of the double layer was decided by observing the section thereof.

The water repellency was measured through weight sensing when the measurement was carried out at 120° C. for 24 hours under the N$_2$ atmosphere using TGA.

TABLE 1

| D | optimum exposure energy (mJ/cm$^2$) | residual layer ratio (%) | adhesion (µm) | taper angle (°) | water repellency (%) | double layer |
|---|---|---|---|---|---|---|
| Ex. 1 | 60 | 95 | 5 | 18 | 0.5 | ○ |
| Ex. 2 | 70 | 99 | 3 | 25 | 0.7 | ○ |
| Co. Ex. 1 | 1000 | 98 | 30 | 69 | 0.6 | ○ |
| Co. Ex. 2 | overdeveloping | No measuring D | No measuring | No measuring | 1.0 | No measuring |
| Co. Ex. 3 | 210 | 92 | 50 | 85 | 5.4 | X |
| Co. Ex. 4 | 340 | 87 | 50 | 68 | 5.1 | X |
| Co. Ex. 5 | 270 | 78 | 40 | 59 | 4.7 | ○ |

As described in the results of Table 1, the organic insulating layer can maximize sensitivity by using the positive photosensitive polyimide composition that is manufactured by mixing polyimide and the polyamic acid like Example, and has the high residual layer ratio and excellent adhesion in respects to the substrate. Above all, the taper angle of the pattern is low, and excellent water repellency is shown because of formation of the double layer structure of the pattern, thus the organic light-emitting device that includes the same may show excellent resolution.

INDUSTRIAL APPLICABILITY

A organic insulating layer for OLED that is manufactured by using the positive photosensitive polyimide composition according to the present invention may control a low taper angle and outgassing, and has excellent adhesion, water repellent control ability, and storage stability and the like. Thus, the organic light-emitting device that includes the organic insulating layer may realize high resolution.

The invention claimed is:

1. A positive photosensitive polyimide composition comprising:
   a) a polyimide that includes the repeating unit of Formula 1

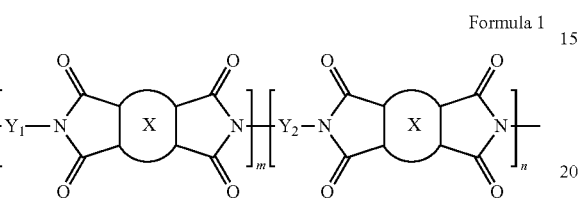

Formula 1 wherein m is an integer in the range of 1 to 30,
n is an integer in the range of 1 to 10,
X is selected from the group consisting of tetravalent aromatic organic groups of Formulas a to k

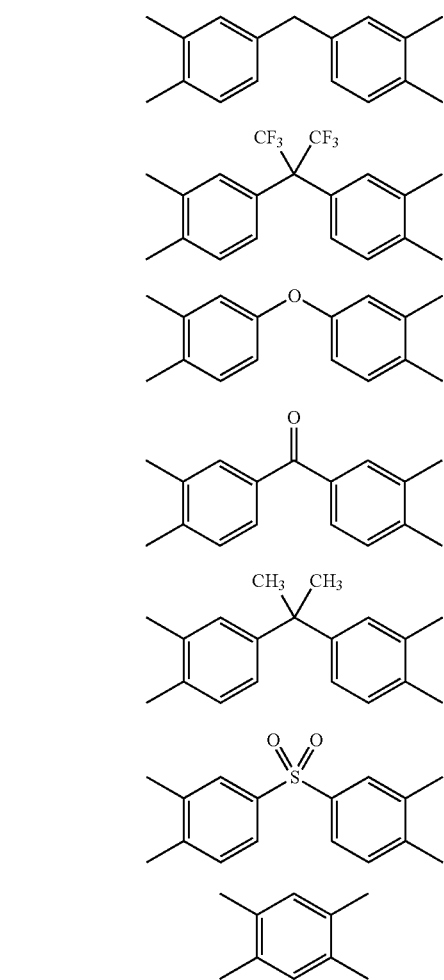

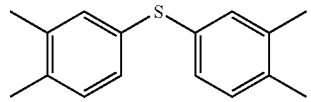

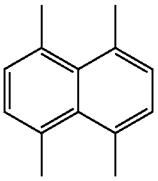

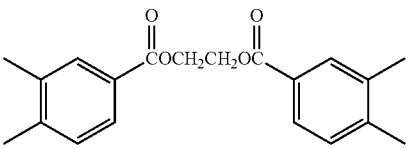

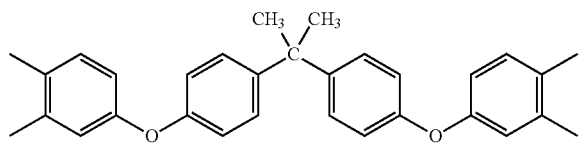

$Y_1$ is selected from the group consisting of the divalent aromatic organic groups

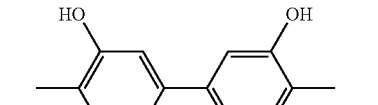

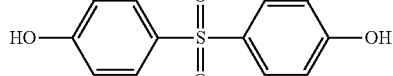

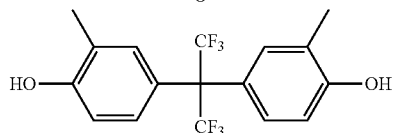

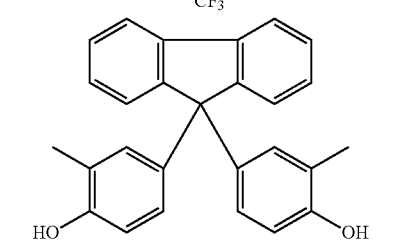

and
$Y_2$ is a divalent silicon based substituent group of formula 3:

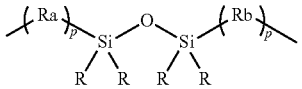

Formula 3 wherein p is an integer in the range of 3 to 5,

R each independently are selected from the group consisting of —CH$_3$, —CH$_2$CH$_3$, and —CH$_2$CH$_2$CH$_3$ and may be the same or different from each other, and
Ra and Rb each independently are a straight- or branched-chain alkylene group having 3 to 5 carbon atoms and may be the same or different from each other;
b) a polyamic acid that includes 100 mol % of the repeating unit of Formula 2

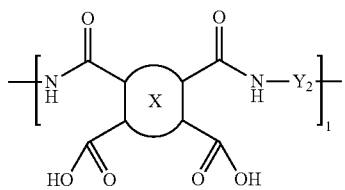

Formula 2 wherein 1 is an integer in the range of 1 to 20,
X is selected from the group consisting of the tetravalent aromatic organic groups of Formulas a to k above, and
Y$_2$ is a divalent silicon based substituent group of formula 3:

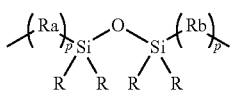

Formula 3 wherein p is an integer in the range of 3 to 5,
R each independently are selected from the group consisting of —CH$_3$, —CH$_2$CH$_3$, and —CH$_2$CH$_2$CH$_3$ and may be the same or different from each other, and
Ra and Rb each independently are a straight- or branched-chain alkylene group having 3 to 5 carbon atoms and may be the same or different from each other; and
c) a photoactive compound.

2. The positive photosensitive polyimide composition as set forth in claim 1, wherein the photoactive compound is selected from the group consisting of any one or more of:

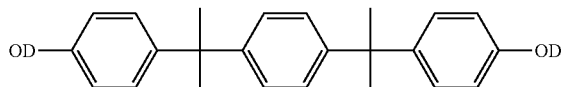

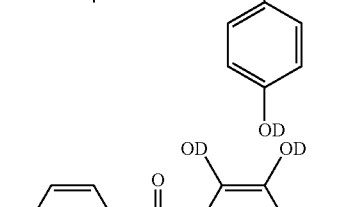

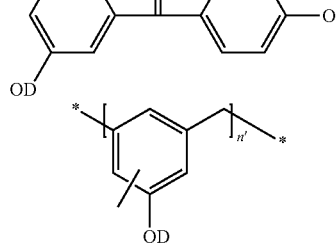

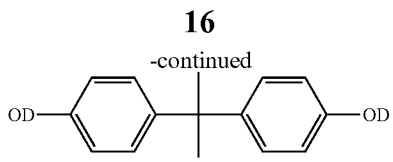

wherein OD is

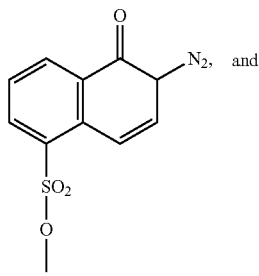

and
n' is an integer in the range of 5 to 20.

3. The positive photosensitive polyimide composition as set forth in claim 1, which comprises 60 to 95% by weight of polyimide that is a solid and 5 to 40% by weight of the polyamic acid based on the sum of polyimide and polyamic acid, and 1 to 50 parts by weight of the photoactive compound based on 100 parts by weight of the total weight of the polyimide and the polyamic acid.

4. The positive photosensitive polyimide composition as set forth in claim 1, wherein the positive photosensitive polyimide composition further comprises an adhesion promoting agent, a surfactant, or a solvent.

5. A positive photosensitive polyimide composition comprising:
a) a polyimide of Formula 1

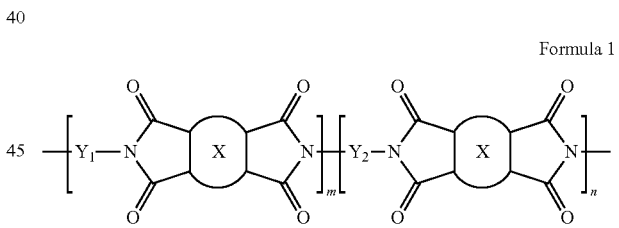

Formula 1 wherein m is an integer in the range of 1 to 30,
n is an integer in the range of 1 to 10,
X is selected from the group consisting of tetravalent aromatic organic groups of Formulas a to k

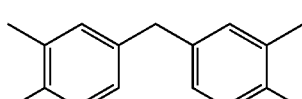

a

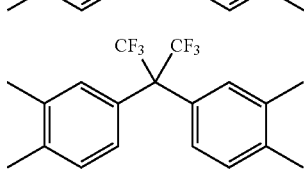

b

-continued c
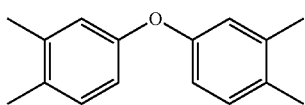

d
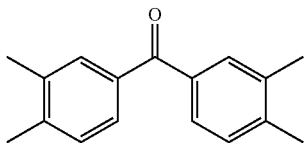

e
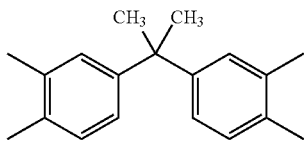

f
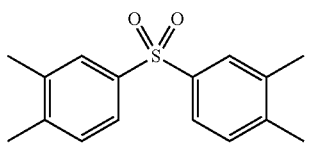

g
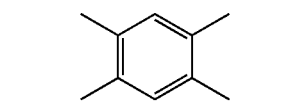

h
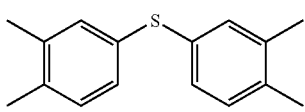

i
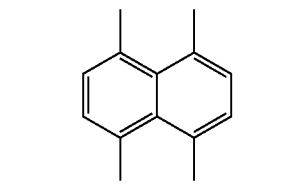

j
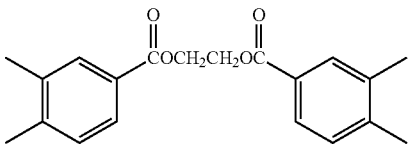

k
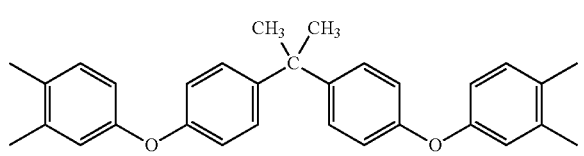

$Y_1$ is selected from the group consisting of the divalent aromatic organic groups

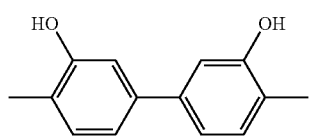

-continued

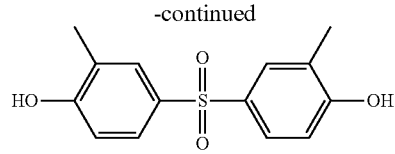

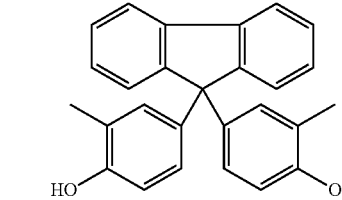

and
$Y_2$ is a divalent silicon based substituent group of formula 3:

Formula 3 wherein p is an integer in the range of 3 to 5,
R each independently are selected from the group consisting of —$CH_3$, —$CH_2CH_3$, and —$CH_2CH_2CH_3$ and may be the same or different from each other, and
Ra and Rb each independently are a straight- or branched-chain alkylene group having 3 to 5 carbon atoms and may be the same or different from each other;
  b) a polyamic acid that includes 100 mol % of the repeating unit of Formula 2

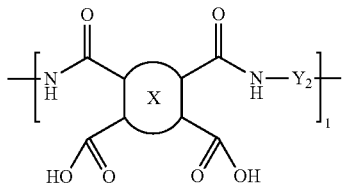

Formula 2 wherein 1 is an integer in the range of 1 to 20,
X is selected from the group consisting of the tetravalent aromatic organic groups of Formulas a to k above,
and
$Y_2$ is a divalent silicon based substituent group of formula 3:

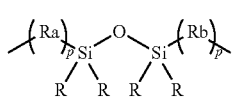

Formula 3 wherein p is an integer in the range of 3 to 5,
R each independently are selected from the group consisting of —$CH_3$, —$CH_2CH_3$, and —$CH_2CH_2CH_3$ and may be the same or different from each other, and
Ra and Rb each independently are a straight- or branched-chain alkylene group having 3 to 5 carbon atoms and may be the same or different from each other; and
  c) a photoactive compound.
6. The positive photosensitive polyimide composition as set forth in claim 5, wherein the photoactive compound is selected from the group consisting of any one or more of:

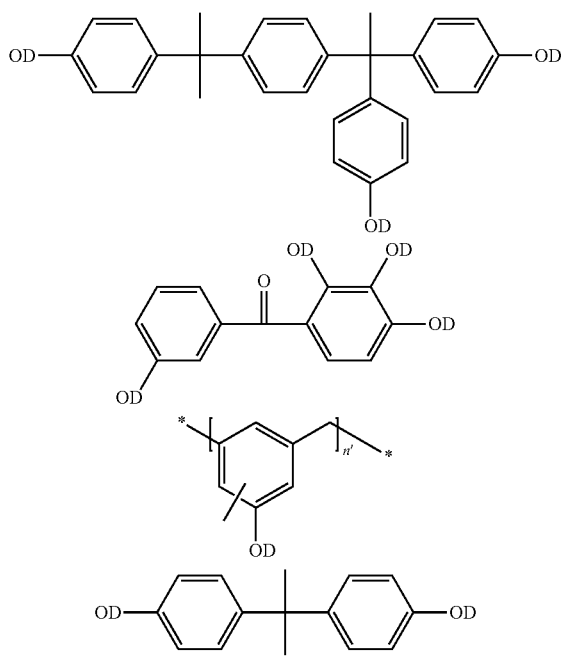

wherein OD is

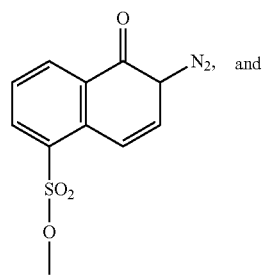

n' is an integer in the range of 5 to 20.

7. The positive photosensitive polyimide composition as set forth in claim 5, which comprises 60 to 95% by weight of polyimide that is a solid and 5 to 40% by weight of the polyamic acid based on the sum of polyimide and polyamic acid, and 1 to 50 parts by weight of the photoactive compound based on 100 parts by weight of the total weight of the polyimide and the polyamic acid.

8. The positive photosensitive polyimide composition as set forth in claim 5, wherein the positive photosensitive polyimide composition further comprises an adhesion promoting agent, a surfactant, or a solvent.

\* \* \* \* \*